(12) United States Patent
Tang

(10) Patent No.: US 7,947,902 B2
(45) Date of Patent: May 24, 2011

(54) ELECTRONIC DEVICE ENCLOSURE

(75) Inventor: Zi-Ming Tang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 220 days.

(21) Appl. No.: 12/353,414

(22) Filed: Jan. 14, 2009

(65) Prior Publication Data

US 2010/0089604 A1 Apr. 15, 2010

(30) Foreign Application Priority Data

Oct. 10, 2008 (CN) .......................... 2008 1 0304878

(51) Int. Cl.
*H05K 5/00* (2006.01)

(52) U.S. Cl. .............. 174/50; 174/58; 174/60; 439/535; 248/906

(58) Field of Classification Search .................... 174/50, 174/66, 67, 58, 60; 439/535; 220/4.02; 248/906
See application file for complete search history.

(56) References Cited

U.S. PATENT DOCUMENTS

2008/0042448 A1* 2/2008 Ge et al. ........................ 292/137

FOREIGN PATENT DOCUMENTS

CN 2657066 Y 11/2004

* cited by examiner

*Primary Examiner* — Dhiru R Patel
(74) *Attorney, Agent, or Firm* — Clifford O. Chi

(57) ABSTRACT

An electronic device enclosure includes a housing and a cover fixed on the housing. The housing defines a first latching portion, and the cover defines a plurality of first latching hooks to engage with the first latching portion. The electronic device enclosure further includes an urging assembly rotatably assembled in the housing to contact the first latching hooks, and an operating member positioned in the housing and contacting the urging assembly. The operating member is capable of pushing the urging assembly to rotate so that the first latching hooks bends and disengages from the first latching portion.

20 Claims, 8 Drawing Sheets

ELECTRONIC DEVICE ENCLOSURE

BACKGROUND

1. Technical Field

The present disclosure relates to an enclosure for use in an electronic device.

2. Description of Related Art

Electronic devices, such as desktop computers, notebook computers, and digital video disc players, are very popular and widely used. An electronic device generally includes an enclosure securing electronic components therein.

A typical electronic device enclosure includes a housing and a cover fixed on the housing to cover an opening of the housing. The cover may be fixed on the housing by screws or bolts. However, it is very inconvenient for assembly or disassembly, because screws or bolts must be screwed or unscrewed one by one. In addition, the electronic device enclosure can deform after multiple assemblies or disassemblies, thereby causing an unsatisfactory.

Another typical electronic device enclosure includes a housing, a cover, a plurality of latching hooks formed on the cover, and a plurality of latching steps defined on the housing corresponding to the latching hooks. The cover is fixed on the housing by applying an external force to press the cover until the latching hooks are latched with the latching steps. However, a strong external force is necessary to detach the latching hooks from the latching steps to remove the cover from the housing. Therefore, it is difficult to disassemble the cover from the housing. Moreover, the latching hooks may break during disassembly from the strong external force, thereby damaging the electronic device enclosure.

What is needed, therefore, is a new electronic device enclosure that overcomes the above mentioned disadvantages.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION OF THE EMBODIMENTS

Figure 1:
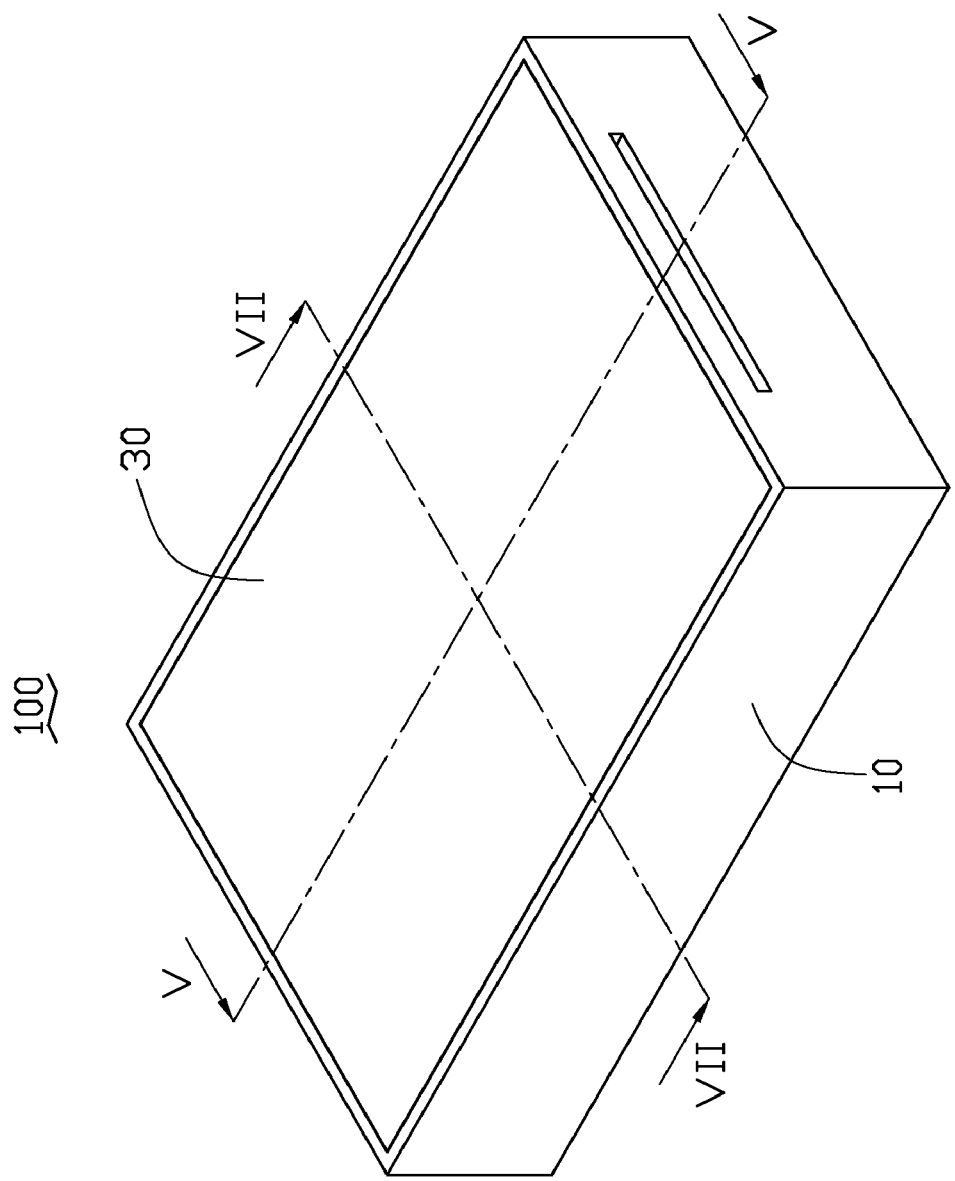
FIG. 1 is an isometric view of an embodiment of an electronic device enclosure, the electronic device enclosure including a cover and a housing.
Figure 2:
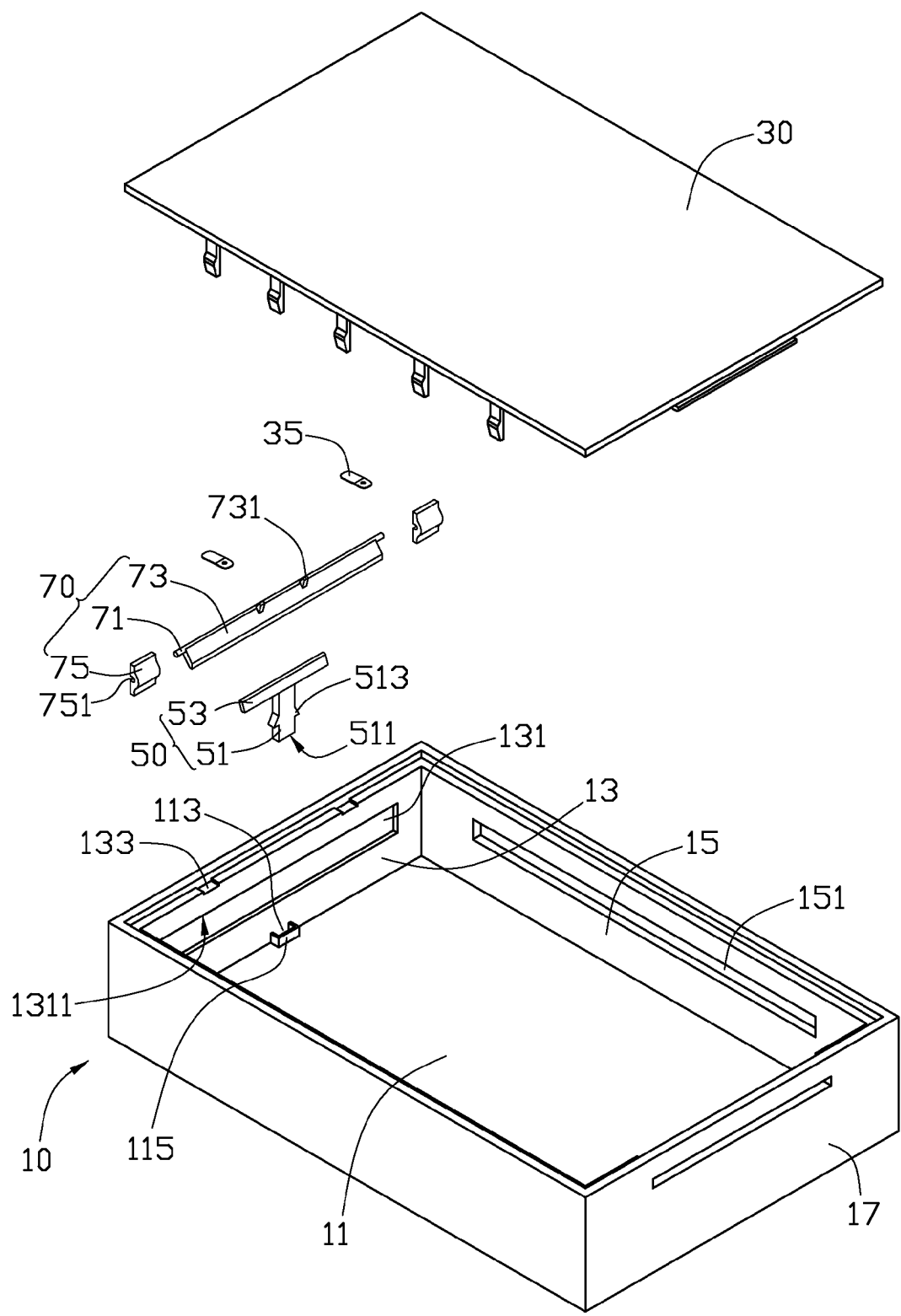
FIG. 2 is an exploded, isometric view of the electronic device enclosure in FIG. 1.

Referring to FIGS. 1 and 2, an electronic device enclosure 100 includes a housing 10, a cover 30 fixed on the housing 10, an operating member 50 positioned in the housing 10, and an urging assembly 70 assembled in the housing 10.

The housing 10 includes a rectangular base 11, a first sidewall 13, two second sidewalls 15, and a third sidewall 17. Each sidewall extends substantially perpendicularly from a periphery of the base 11, with the first sidewall 13 opposite the third sidewall 17, and the two second sidewalls 15 opposite to each other.

A mounting portion 115 extends from an end of the base 11 adjacent to the first sidewall 13. The mounting portion 115 and the first sidewall 13 cooperatively define a mounting hole 113 to engage with the operating member 50. The mounting hole 113 runs through the base 11. The first sidewall 13 defines a first latching portion 131 in an inner surface of the first sidewall 13, and two limiting grooves 133 in a top surface of the first sidewall 13. The first latching portion 131 has a latching surface 1311 defined on a top of the first latching portion 131. The second sidewall 15 defines a second latching portion 151 in an inner surface of the second sidewall 15. The third sidewall 17 defines an engaging hole 171 (shown in FIG. 5) in an inner surface of the third sidewall 17. In the illustrated embodiment, the first latching portion 131 and the second latching portion 151 are latching grooves.

Figure 3:
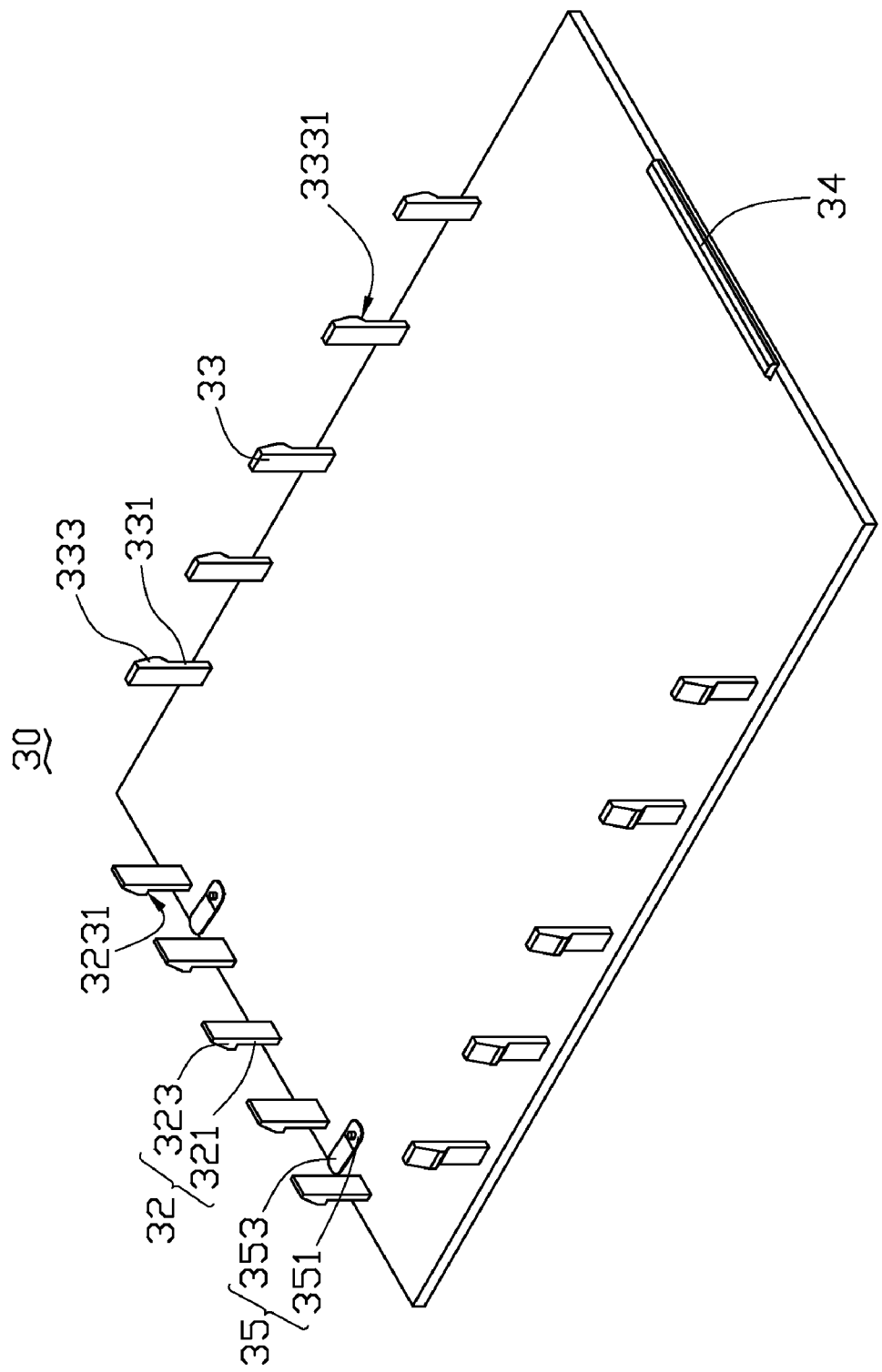
FIG. 3 is an isometric view of the cover of the electronic device enclosure in FIG. 2.

Referring to FIG. 3, the cover 30 may be a substantially rectangular plate, and includes a plurality of first latching hooks 32, a plurality of second latching hooks 33, and an engaging protrusion 34. The first latching hooks 32 are formed on a first edge portion of the cover 30. The second latching hooks 33 are formed on opposite second edge portions of the cover 30 substantially perpendicular to the first edge portion. The engaging protrusion 34 is formed on a third edge portion of the cover 30 opposite to the first edge portion. The cover 30 further includes two elastic piece 35 fixed on the first edge portion of the cover 30 adjacent to the first latching hooks 32.

The first latching hook 32 includes a guiding portion 321 and a latching protrusion 323 formed on an end of the guiding portion 321. The latching protrusion 323 has a latching surface 3231 adjoining the guiding portion 321. The latching surface 3231 is substantially planar and substantially perpendicular to the guiding portion 321. The second latching hook 33 is similar in principle to the first latching hook 32. However, a latching surface 3331 of a latching protrusion 333 adjoining a guiding portion 331 may be slanted, such that the latching surface 3331 and the guiding portion 331 cooperatively define an obtuse angle. The elastic piece 35 includes a fixing end 351 fixed on the cover 30, and a free end 353 extending from the fixing end 351.

Referring to FIG. 2 again, the operating member 50 may be substantially T-shaped, and includes an operating portion 51 and an abutting portion 53 formed on an end of the operating portion 51. The operating portion 51 includes an operating surface 511 defined on an end, and two limiting protrusions 513 formed on opposite sides of the operating portion 51.

The urging assembly 70 includes a rotatable shaft 71, an urging plate 73 connected to the rotatable shaft 71, and two fixing members 75 configured to assemble the urging assembly 70 in the housing 10. Two ends of the rotatable shaft 71 extend out from two sides of the urging plate 73. The urging plate 73 defines two limiting blocks 731 on an end connecting to the rotatable shaft 71. The fixing member 75 defines a retaining groove 751 in a middle portion of the fixing member 75. In an alternative embodiment, the urging plate 73 may be integrally formed with the rotatable shaft 71.

Figure 4:
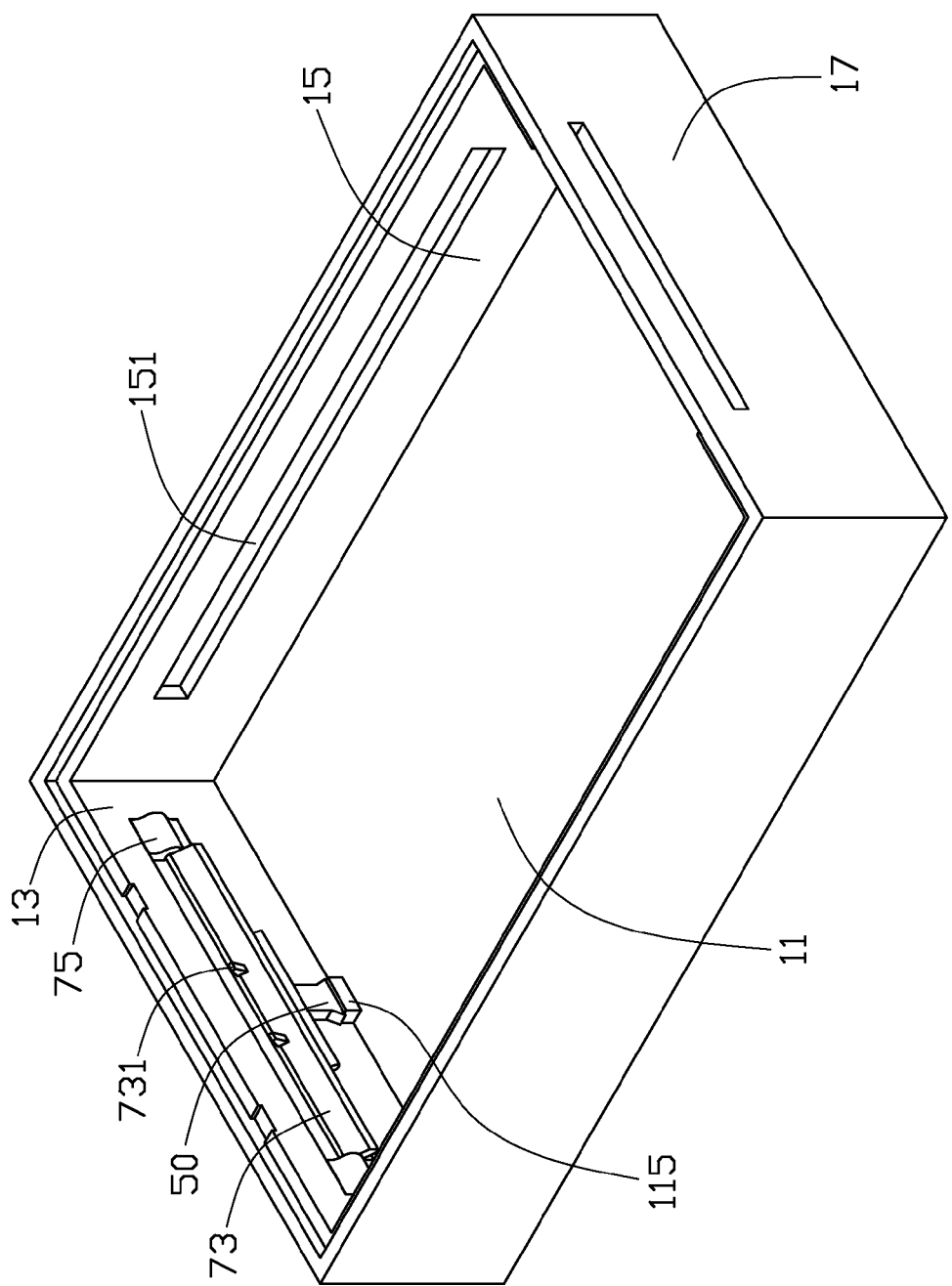
FIG. 4 is a partial, assembled view of the electronic device enclosure in FIG. 2.

Referring also to FIG. 4, in assembly of the electronic device enclosure 100, the operating member 50 is inserted into the mounting hole 113 of the housing 10. The limiting protrusions 513 abut on a top surface of the mounting portion 115 to prevent the operating member 50 from disengaging from the housing 10. The operating surface 511 of the operating member 50 is exposed to an outer surface of the base 11 to facilitate operation of the operating member 50. In one embodiment, the operating surface 511 is substantially coplanar with the outer surface of the base 11 to prevent misoperation. The two fixing members 75 are fixed in two ends of the first latching portion 131. The two ends of the rotatable shaft 71 are rotatably inserted into the retaining grooves 751 of the two fixing members 75. Thus, the operating member 50 and the urging assembly 70 are assembled in the housing 10 and contact each other.

Figure 5:
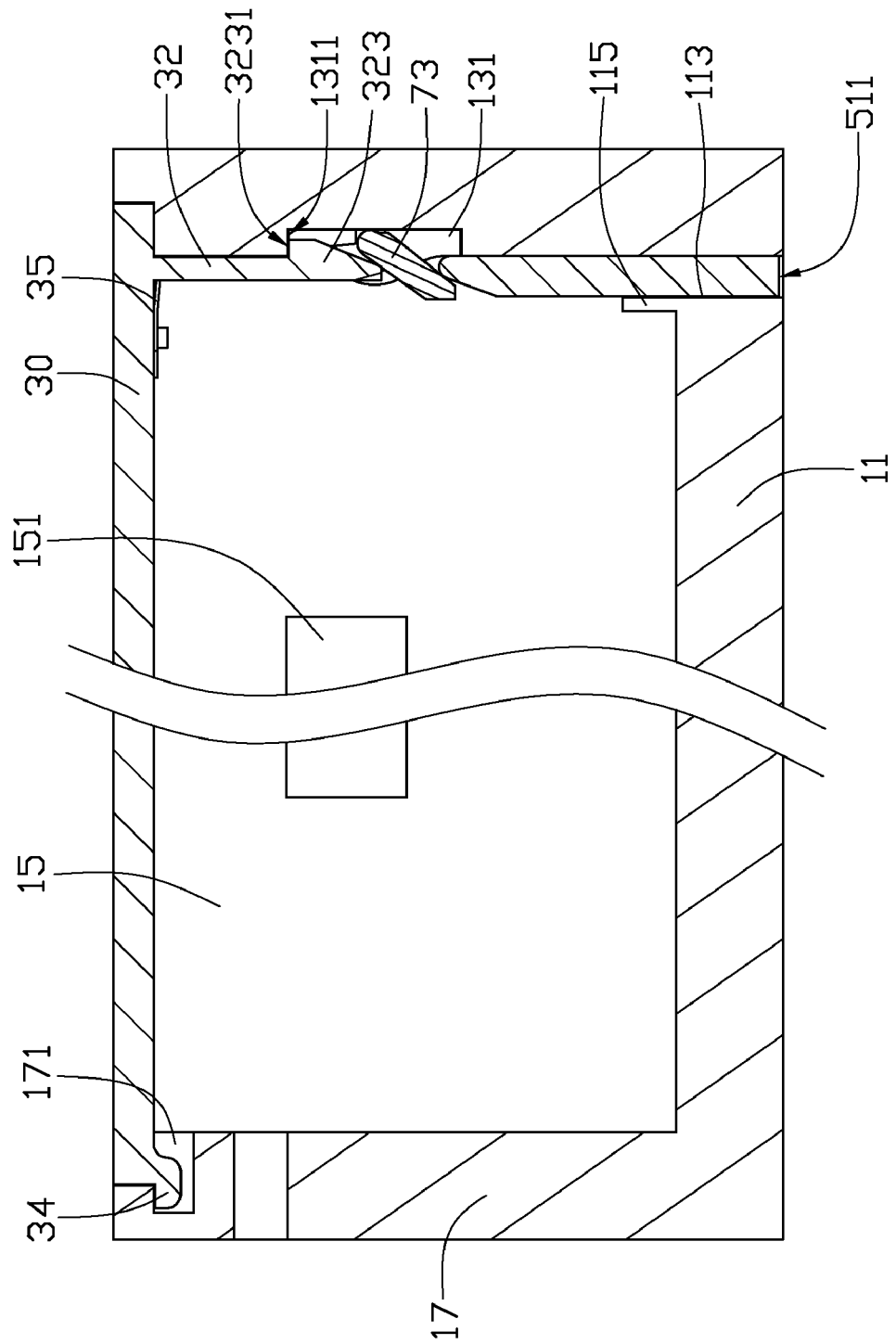
FIG. 5 is a cross-sectional view of the electronic device enclosure taken along line V-V in FIG. 1.
Figure 6:
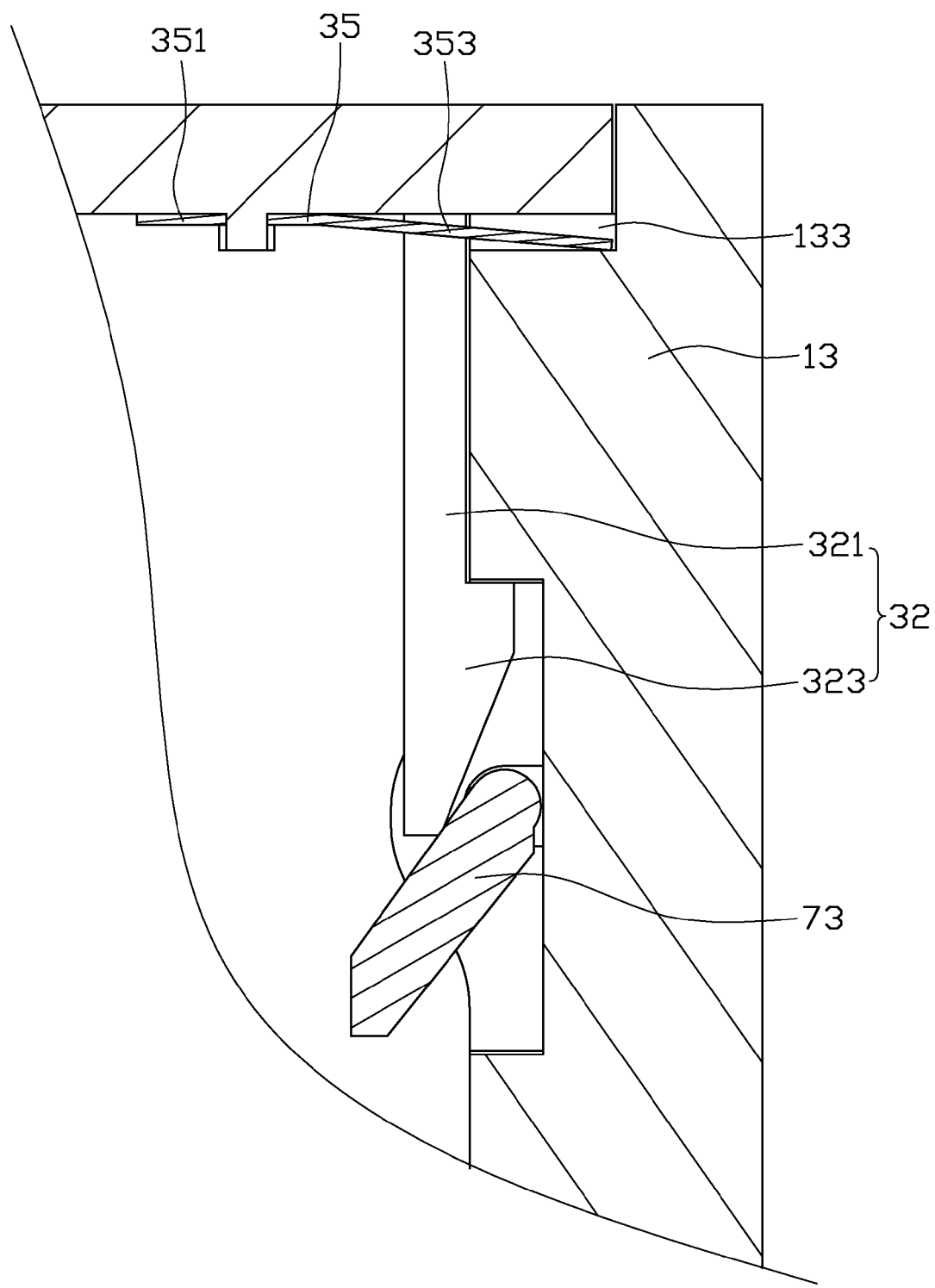
FIG. 6 is a partial, enlarged view of the electronic device enclosure in FIG. 5, showing the cover being assembled on the housing.
Figure 7:
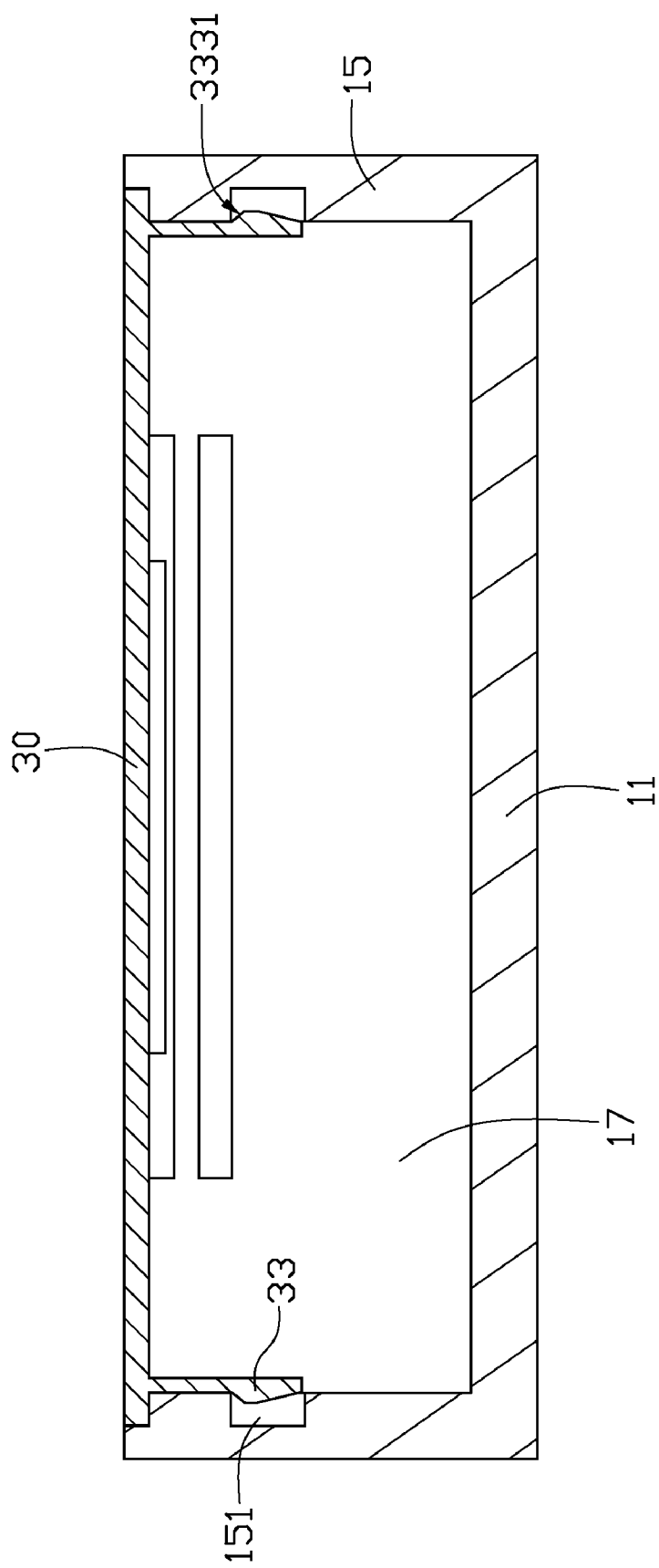
FIG. 7 is a cross-sectional view of the electronic device enclosure taken along line VII-VII in FIG. 1.

Referring to FIG. 5, when assembling the cover 30 on the housing 10, the engaging protrusion 34 of the cover 30 is engaged in the engaging hole 171 of the housing 10. The cover 30 is then pressed until the latching protrusions 323 of the first latching hooks 32 are engaged in the first latching portion 131 of the housing 10, and the latching surfaces 3231 of the first latching hooks 32 are engaged with the latching surface 1311 of the first latching portion 131. The free ends 353 of the elastic pieces 35 are inserted into the limiting groove 133 of the housing 10 (shown in FIG. 6). The elastic piece 35 reaches a compressed state due to restriction of the limiting groove 133. Simultaneously, the second latching hooks 33 are engaged in the second latching portions 151 of the housing 10 (shown in FIG. 7). Thus, the cover 30 is assembled on the housing 10. The cover 30 can be stably secured on the housing 10 because the latching surface 3231 is reliably engaged with the latching surface 1311.

Figure 8:
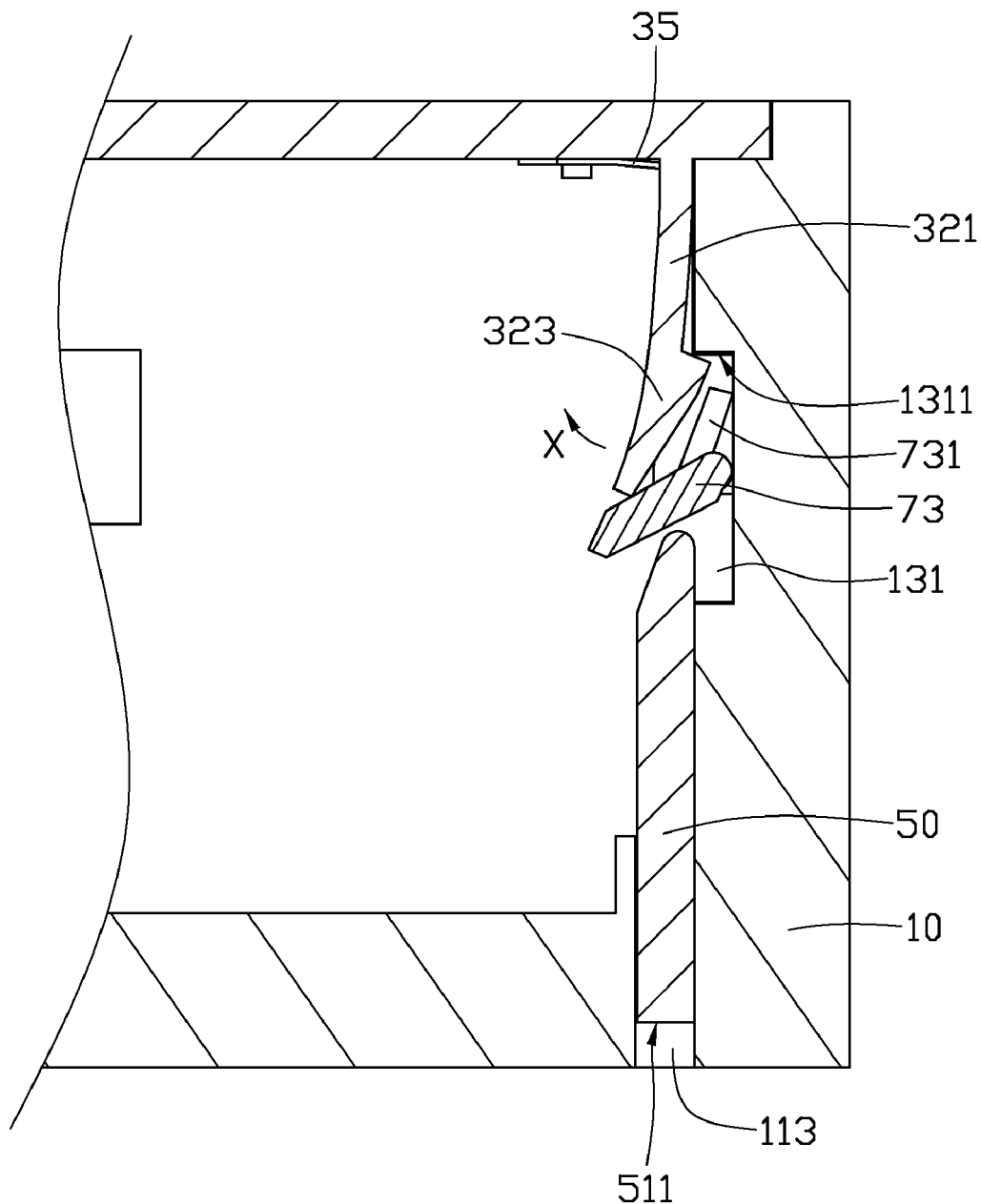
FIG. 8 is a partial, enlarged view of the electronic device enclosure in FIG. 5, showing the cover being disassembled from the housing.

Referring also to FIG. 8, when disassembling the cover 30 from the housing 10, an external force is applied on the operating surface 511, so that the operating member 50 is moved into the housing 10 to push the urging plate 73. Thus, the urging plate 73 rotates around the rotatable shaft 71 and pushes the first latching hooks 32 to bend towards the X direction, such that the latching protrusions 323 disengage from the first latching portion 131. When the urging plate 73 rotates, the limiting blocks 731 abut the inner surface of the first latching portion 131, thereby preventing the urging plate 73 from rotating to a large angle. Sequentially, the elastic pieces 35 are relaxed, so that the end of the cover 30 is partially pushed out of the housing 10 via the elastic force created by the elastic pieces 35. The end of the cover 30 may then be lifted until the second latching hooks 33 disengage from the second latching portions 151. Only a small force is needed to detach the second latching hooks 33, thereby limiting and reducing damages on the electronic device enclosure 100, because the latching surface 3331 of the second latching hook 33 is slanted. Finally, the cover 30 may be lifted away from the housing 10 so that the engaging protrusion 34 disengages from the engaging hole 171.

The cover 30 can be stably assembled on the housing 10 by pressing the cover 30, and the cover 30 can be easily disassembled from the housing 10 by pressing the operating surface 511 of the operating member 50. Thus, it is convenient for assembling or disassembling the electronic device enclosure 100. Moreover, in assembly or disassembly, deformation or damage of the electronic device enclosure 100 is avoided.

In alternative embodiments, the abutting portion 53 of the operating member 50 may be elongated to directly push the first latching hooks 32, so that the urging assembly 70 may be omitted. In addition, the first latching portion 131 and the second latching portion 151 may be latching protrusions, and the first latching hooks 32 and the second latching hooks 33 may be engaged with bottom surfaces of the latching protrusions. Furthermore, the engaging protrusion 34 may be similar to the second latching hooks 33. For example, since most electronic device enclosures have an optical drive socket defined in one sidewall of the housing, the engaging protrusion may engage in the sidewall having the optical drive socket.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device enclosure, comprising:
   a housing comprising a base and a plurality of sidewalls extending substantially perpendicularly from a periphery of the base, a first latching portion is formed in a first sidewall of the plurality of sidewalls;
   a cover comprising a first latching hook to engage with the first latching portion; and
   an operating member comprising an abutting portion and positioned in the first sidewall of the housing adjacent to the first latching portion, wherein the abutting portion is capable of pushing the first latching hook to bend away from the first sidewall and disengage from the first latching portion.

2. The electronic device enclosure of claim 1, wherein the base is substantially rectangular and the plurality of sidewalls comprises the first sidewall, two opposite second sidewalls, and a third sidewall; the first, the two second, and the third sidewalls extend substantially perpendicularly from the periphery of the base.

3. The electronic device enclosure of claim 2, wherein the first latching portion is a latching groove defined in an inner surface of one of the sidewalls.

4. The electronic device enclosure of claim 3, wherein the first latching hook comprises a guiding portion and a latching protrusion formed on an end of the guiding portion to engage in the first latching portion.

5. The electronic device enclosure of claim 4, wherein the latching protrusion comprises a latching surface adjoining the guiding portion, and the latching surface is substantially planar and substantially perpendicular to the guiding portion.

6. The electronic device enclosure of claim 2, wherein the base defines a mounting portion on an end adjacent to one of the sidewalls, the mounting portion and the first sidewall cooperatively define a mounting hole; the operating member further comprises an operating portion and the abutting portion is formed on an end of the operating portion, the operating portion is inserted into the mounting hole.

7. The electronic device enclosure of claim 6, wherein the mounting hole runs through the base; the operating portion comprises an operating surface defined on an end of the operating portion, and the operating member further comprises two limiting protrusions formed on opposite sides of the operating portion; the limiting protrusions abut on a top surface of the mounting portion; the operating surface is exposed to an outer surface of the base.

8. The electronic device enclosure of claim 7, wherein the operating surface is substantially coplanar with the outer surface of the base.

9. The electronic device enclosure of claim 2, wherein the housing further comprises two second latching portions on the two opposite second sidewalls respectively; the cover further comprises a plurality of second latching hooks defined on opposite ends of the cover to engage with the two second latching portions.

10. The electronic device enclosure of claim 9, wherein the second latching portions are latching grooves defined in inner surfaces of the two second opposite sidewalls of the housing; each of the second latching hooks comprises a guiding portion and a latching protrusion formed on an end of the guiding portion; the second latching protrusions engage in the latching portions.

11. The electronic device enclosure of claim 10, wherein the latching protrusion of the second latching hook comprises a latching surface adjoining the guiding portion, the latching surface is substantially slanted, such that the latching surface and the guiding portion cooperatively define an obtuse angle there between.

12. The electronic device enclosure of claim 9, wherein the first latching portion and the two second latching portions are latching protrusions on inner surfaces of the housing; the first latching hook engaging with a bottom surface of the first latching protrusion and the two second latching hooks engage with bottom surfaces of the two second latching protrusions, respectively.

13. The electronic device enclosure of claim 2, wherein the housing defines an engaging hole in an inner surface of one of the sidewalls; the cover defines an engaging protrusion formed on an end of the cover; the engaging protrusion is engaged in the engaging hole.

14. The electronic device enclosure of claim 1, wherein the cover further comprises an elastic piece fixed on an end of the cover adjacent to the first latching hook; the housing defines a limiting groove in a top surface of one of the sidewalls; the elastic piece is inserted into the limiting groove.

15. An electronic device enclosure, comprising:
 a housing comprising a base and a plurality of sidewalls extending substantially perpendicularly from a periphery of the base, a first latching portion formed in a first sidewall of the plurality of sidewalls;
 a cover comprising a first latching hook to engage with the first latching portion;
 an urging assembly rotatably assembled in the first sidewall of the housing and configured to contact the first latching hook, and
 an operating member comprising an abutting portion and positioned in the first sidewall of the housing and contacting the urging assembly, wherein the abutting portion is capable of pushing the urging assembly to rotate so that the first latching hook bends away from the first sidewall and disengages from the first latching portion.

16. The electronic device enclosure of claim 15, wherein the urging assembly comprises a rotatable shaft, a urging plate connected to the rotatable shaft, and two fixing members to assemble the urging member in the housing.

17. The electronic device enclosure of claim 16, wherein the first latching portion is a latching groove defined in an inner surface of the housing; the two fixing members are fixed at two ends of the latching groove; two ends of the rotatable shaft extend out from corresponding sides of the urging plate, each of the fixing members defines a retaining groove therein; the two ends of the rotatable shaft are rotatably inserted into the retaining grooves.

18. The electronic device enclosure of claim 16, the urging plate comprises two limiting blocks on an end connecting to the rotatable shaft.

19. The electronic device enclosure of claim 15, wherein the housing further comprises two second latching portions on an inner surface of the housing; the cover comprises a second latching hook at an end of the cover to engage with the second latching portions.

20. The electronic device enclosure of claim 15, wherein the cover further comprises an elastic piece fixed on an end of the cover adjacent to the first latching hook; the housing defines a limiting groove in a top surface of one of the sidewalls; the elastic piece is inserted into the limiting groove.

* * * * *